United States Patent
Suh

(10) Patent No.: US 6,930,019 B2
(45) Date of Patent: Aug. 16, 2005

(54) METHOD FOR FORMING MOS TRANSISTOR

(75) Inventor: Moon Sik Suh, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 8 days.

(21) Appl. No.: 10/876,232

(22) Filed: Jun. 24, 2004

(65) Prior Publication Data

US 2005/0130388 A1 Jun. 16, 2005

(30) Foreign Application Priority Data

Dec. 15, 2003 (KR) ...................... 10-2003-0091450

(51) Int. Cl.$^7$ ........................................... H01L 21/336

(52) U.S. Cl. ....................... 438/438; 438/629; 438/672

(58) Field of Search ............................... 438/299–307, 438/626–629, 668–675

(56) References Cited

U.S. PATENT DOCUMENTS 6,858,529 B2 * 2/2005 Chung et al. ................ 438/629

* cited by examiner

Primary Examiner—H. Jey Tsai
(74) Attorney, Agent, or Firm—Ladas & Parry LLP

(57) ABSTRACT

Disclosed is a MOS transistor formation method including the steps of: forming a gate oxide film and a gate electrode on a device region of a silicon substrate; forming a nitride film spacer on one side surface of the gate electrode; forming an interlayer dielectric layer on an upper surface of overall structure inclusive of the nitride film spacer; forming a landing plug contact hole by over-etching the interlayer dielectric layer and an active region of the silicon substrate; forming an oxide film on an upper surface of overall structure inclusive of the landing plug contact hole; forming a side wall oxide film spacer by selectively eliminating the oxide film so that the oxide film remains only on a side wall of the landing plug contact hole; forming a first landing plug pattern in a lower portion of the landing plug contact hole; eliminating exposed side wall oxide film spacer and etching inside of a first landing plug pattern, thereby forming an auxiliary groove which expands area of the landing plug contact hole; and forming a second landing plug pattern in the landing plug contact hole including the first landing plug pattern and the auxiliary groove.

14 Claims, 5 Drawing Sheets

METHOD FOR FORMING MOS TRANSISTOR

BACKGROUND OF THE INVENTION

1. Field of the Invention

The present invention relates to a MOS transistor formation method in a semiconductor device. More particularly, the present invention relates to a MOS transistor formation method, in which, during formation of a MOS transistor, when a refresh time is improved by blocking phosphorus out diffusion and improving electric field by means of an oxide film side wall after forming a landing plug contact (LPC), an oxide film side wall on a silicon (Si) surface is eliminated and an electric current path is induced to the surface so as to compensate for electric current reduction due to increase of LDD resistance, so that a write margin of a cell transistor can be improved.

2. Description of the Prior Art

A MOS transistor formation method according to the prior art will be described with reference to FIGS. 1a to 1d.

FIGS. 1a to 1d are sectional views according to steps in the MOS transistor formation method according to the prior art.

In the MOS transistor formation method according to the prior art, as shown in FIG. 1a, an isolation layer 13 for isolating a device region is formed in a silicon substrate 11. Then, a gate electrode 21 including a gate oxide film 15, a polysilicon layer 17, and a hard mask layer 19 is formed on the device region of the silicon substrate 11.

Next, an oxidation process is carried out to form an oxide film 23 on one side wall of a polysilicon layer 17 constituting the gate electrode 21 and an upper surface of the silicon substrate 11.

Subsequently, an LDD implanting is carried out to form an LDD implant region 25 in an active region of the silicon substrate 11 below the oxide film 23.

Then, a buffer oxide film 27 and a nitride film acting as a spacer 29 are sequentially deposited on an upper surface of overall structure inclusive of the oxide film 23, and an anisotropic etching process is carried out to selective eliminate the nitride film acting as the spacer 29, the buffer oxide film 27, and the oxide film 23. Therefore, the spacer 29 is formed on a side surface of the gate electrode 21. Herein, a portion of the active region in the silicon substrate 11 is exposed while the spacer 29 is formed.

Subsequently, an interlayer dielectric film 31 is thickly deposited on an upper surface of overall structure inclusive of the exposed active region in the silicon substrate 11.

Next, as shown in FIG. 1b, a photosensitive film pattern is formed in order to form a landing plug contact hole 33 in the interlayer dielectric film 31, and the interlayer dielectric film 31 and the active region portion in the silicon substrate 11 are over-etched using the photosensitive film pattern as a mask. Thereby, the landing plug contact hole 33 is formed. Herein, a portion of the silicon substrate 11 is also etched away when the landing plug contact hole 33 is formed.

Subsequently, as shown in FIG. 1c, the photosensitive film pattern is eliminated, and then a landing plug side wall oxide film 35 is formed on a surface of overall structure inclusive of the landing plug contact hole 33.

Next, the landing plug side wall oxide film 35 is anisotropically dry-etched so that the landing plug side wall oxide film 35 remains only on a side wall of the landing plug contact hole 33.

Subsequently, as shown in FIG. 1d, a polysilicon layer is deposited on an upper surface of overall structure inclusive of the landing plug contact hole 33 to fill in the landing plug contact hole 33.

Next, the polysilicon layer is planarized through a CMP process to form a landing plug 37 in the landing plug contact hole 33.

However, in a structure of a conventional MOS transistor, according to the reduction of a design rule, the thickness of a cell spacer nitride film is reduced, and the out-diffusion of phosphorus of high concentration from a landing plug polysilicon layer increases. Therefore, electric field of a cell transistor increases, thereby degrading refresh time.

When the phosphorus out-diffusion is blocked by means of a landing plug oxide film side wall in order to improve the refresh time, electric current is reduced due to increase of LDD resistance. Therefore, a write margin of the cell transistor is reduced.

SUMMARY OF THE INVENTION

Accordingly, the present invention has been made to solve the above-mentioned problems occurring in the prior art, and it is an object of the present invention to provide a MOS transistor formation method, in which, during formation of a MOS transistor, when a refresh time is improved by blocking phosphorus out diffusion and improving electric field by means of an oxide film side wall after forming a landing plug contact (LPC), an oxide film side wall on a silicon (Si) surface is eliminated and an electric current path is induced to the surface so as to compensate for electric current reduction due to increase of LDD resistance, so that a write margin of a cell transistor can be improved.

In order to achieve the above object, according to one aspect of the present invention, there is provided a MOS transistor formation method comprising the steps of: forming a gate oxide film and a gate electrode on a device region of a silicon substrate; forming a nitride film spacer on one side surface of the gate electrode; forming an interlayer dielectric layer on an upper surface of overall structure inclusive of the nitride film spacer; forming a landing plug contact hole by over-etching the interlayer dielectric layer and an active region of the silicon substrate; forming an oxide film on an upper surface of overall structure inclusive of the landing plug contact hole; forming a side wall oxide film spacer by selectively eliminating the oxide film so that the oxide film remains only on a side wall of the landing plug contact hole; forming a first landing plug pattern in a lower portion of the landing plug contact hole; eliminating exposed side wall oxide film spacer and etching inside of the first landing plug pattern, thereby forming an auxiliary groove which expands area of the landing plug contact hole; and forming a second landing plug pattern in the landing plug contact hole including the first landing plug pattern and the auxiliary groove.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, a preferred embodiment of the present invention will be described with reference to the accompanying drawings.

FIGS. 2a to 2f are sectional views according to steps in a MOS transistor formation method according to the present invention.

Figure 1A:
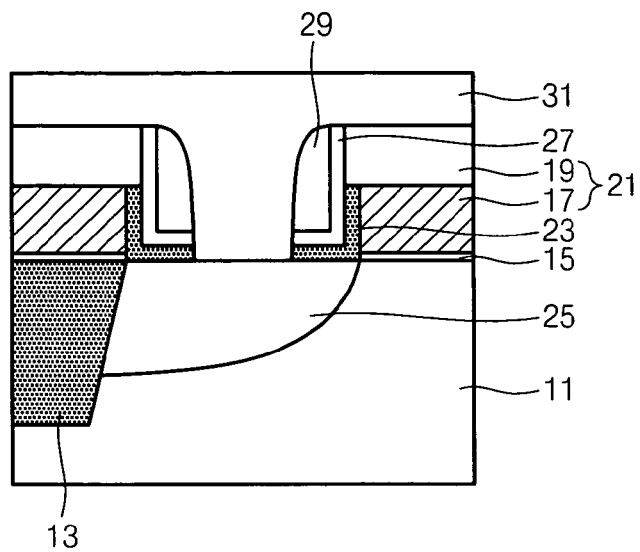
FIGS. 1a to 1d are sectional views according to steps in a MOS transistor formation method according to the prior art.
Figure 1B:
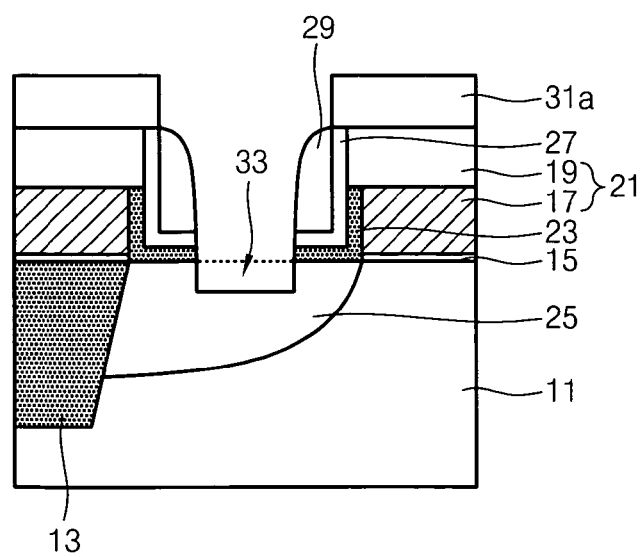
Figure 1C:
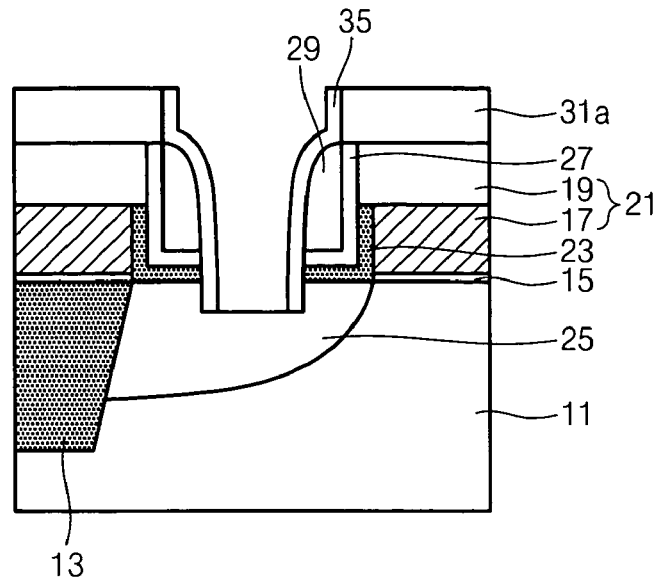
Figure 1D:
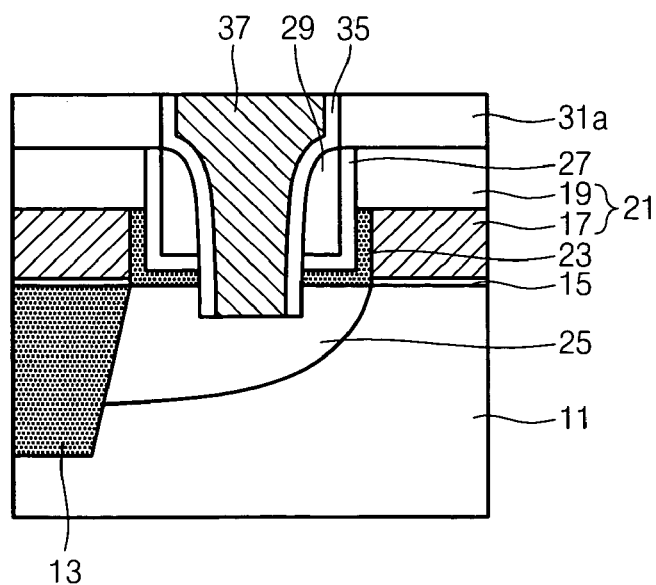
Figure 2A:
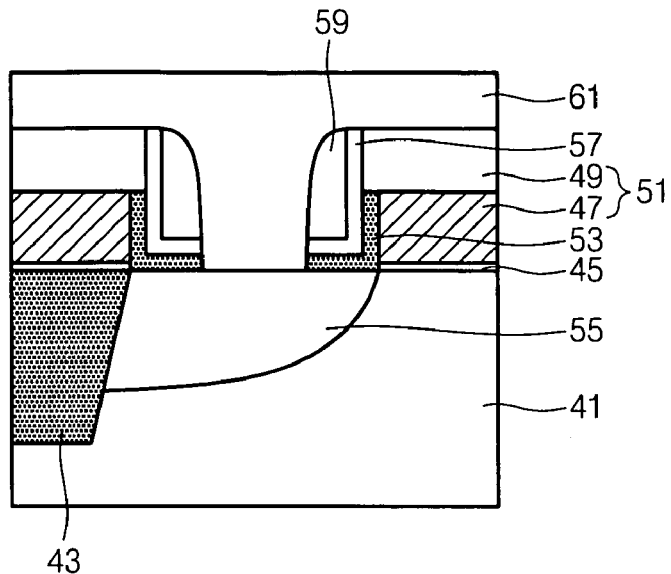
FIGS. 2a to 2f are sectional views according to steps in a MOS transistor formation method according to the present invention.

In the MOS transistor formation method according to the prior art, as shown in FIG. 2a, an isolation layer 43 for isolating a device region is formed in a silicon substrate 41. Then, a gate electrode 51 including a gate oxide film 45, a polysilicon layer 47, and a hard mask layer 49 is formed on the device region of the silicon substrate 41.

Next, an oxidation process is carried out to form a side wall oxide film 53 on one side wall of the polysilicon layer 47 constituting the gate electrode 51 and an upper surface of the silicon substrate 41.

Subsequently, an LDD implanting is carried out to form an LDD implant region 55 in an active region of the silicon substrate 41 below the side wall oxide film 53.

Then, a buffer oxide film 57 and a nitride film for spacer are sequentially deposited on an upper surface of overall structure inclusive of the side wall oxide film 53, and an anisotropic etching process is carried out to selective eliminate the nitride film for spacer, the buffer oxide film 57, and the oxide film 53. Therefore, the oxide film pattern 53, the buffer oxide film pattern 57, and a nitride film spacer 59 are formed on a side surface of the gate electrode 51. Herein, a portion of the active region in the silicon substrate 41 is exposed while the nitride film spacer 59 is formed. Herein, the buffer oxide film may be made from any of oxide-based materials, including HLD, HTO, HDP, USG, and BPSG. Further, the buffer oxide film is controlled to have a thickness of 10 to 200 Å.

Subsequently, an interlayer dielectric film 61 is thickly deposited on an upper surface of overall structure inclusive of the exposed active region in the silicon substrate 41.

Figure 2B:
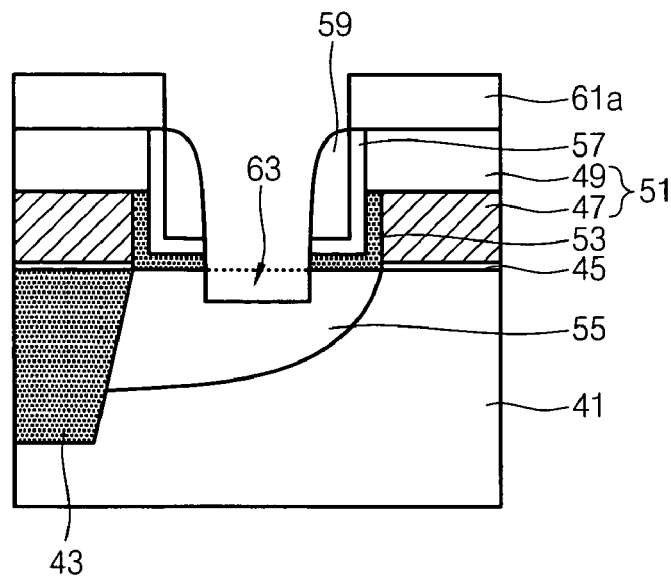

Next, as shown in FIG. 2b, a photosensitive film pattern is formed in order to form a landing plug contact hole 63 in the interlayer dielectric film 61, and the interlayer dielectric film 61 and the active region portion in the silicon substrate 41 are over-etched using the photosensitive film pattern as a mask. Therefore, the landing plug contact hole 63 is formed. Herein, a portion of the silicon substrate 41 is also etched away when the landing plug contact hole 63 is formed.

Figure 2C:
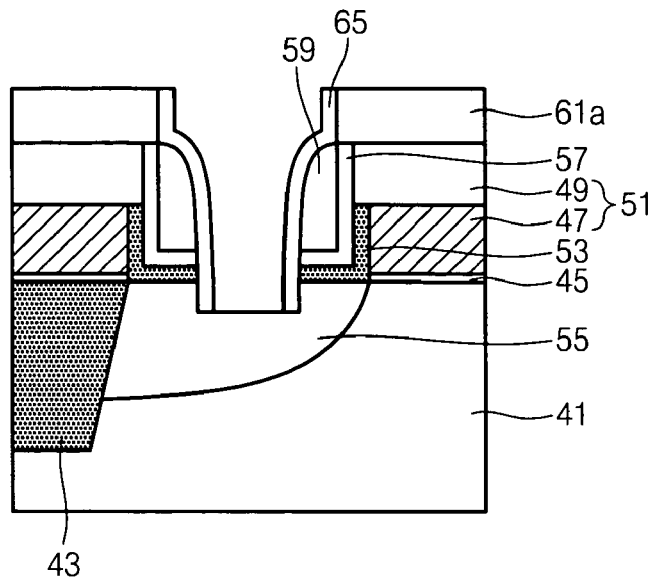

Subsequently, as shown in FIG. 2c, the photosensitive film pattern is eliminated, and then an oxide film 65 having a thickness of about 50 to 200 Å is formed on a surface of overall structure inclusive of the landing plug contact hole 63. Herein, the oxide film 65 may be made from any of oxide-based materials, including HLD, HTO, HDP, USG, and BPSG. In addition, the oxide film 65 may be made from nitride or $Al_2O_3$.

Next, the oxide film 65 is anisotropically dry-etched so that the oxide film 65 remains only on a side wall of the landing plug contact hole 63. Therefore, a side wall oxide film spacer is formed.

Figure 2D:
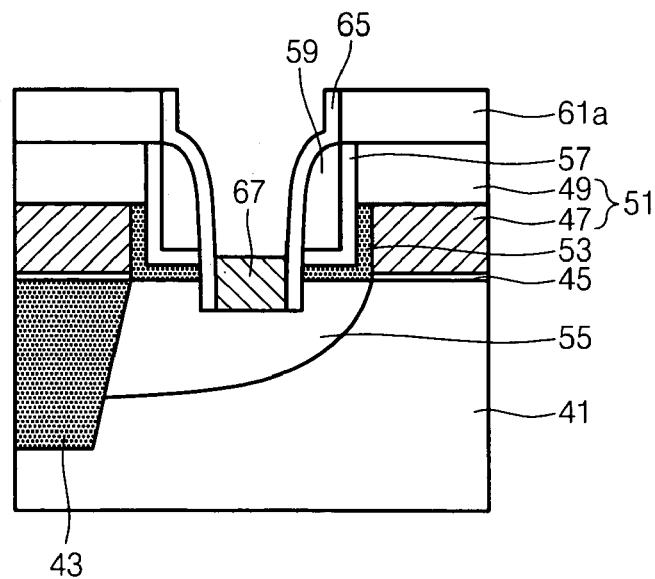

Subsequently, as shown in FIG. 2d, a first polysilicon layer 67 is deposited on an upper surface of overall structure inclusive of the landing plug contact hole 63 to fill in the landing plug contact hole 63. Then, the first polysilicon layer 67 is subjected to an ecthback process so that the first polysilicon layer 67 remains with a thickness of about 50 to 500 Å only on an over-etched portion of the silicon substrate 41 in the landing plug contact hole 63. Herein, the first polysilicon layer 67 may be made from doped or undoped polysilicon. In addition, the first polysilicon layer 67 may be made from nitride or $Al_2O_3$.

Figure 2E:
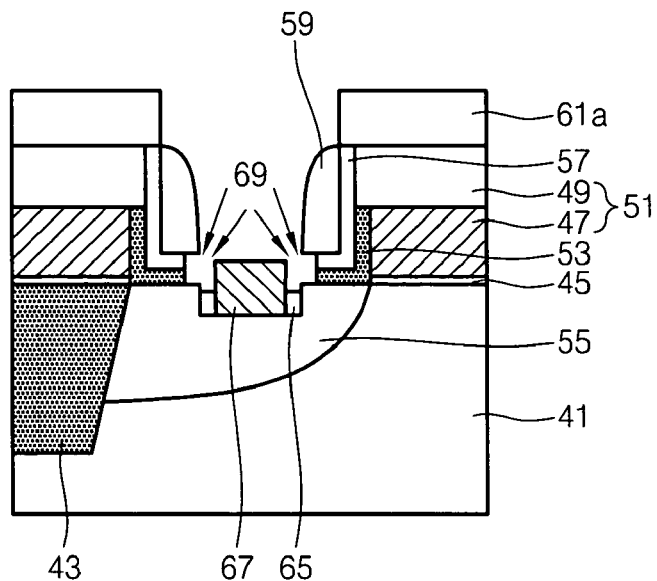

Next, as shown in FIG. 2e, a wet etching is carried out to eliminate a side portion of each side wall oxide film spacer 65 remaining on a side wall of the landing plug contact hole 63 except for a lower portion of each side wall oxide film spacer 65 located in a lower portion of the landing plug contact hole 63. Simultaneously, the buffer oxide film pattern 57 and the oxide film pattern 53 are partly etched from portions surrounding the first polysilicon layer 67, thereby forming an auxiliary groove 69. Herein, the wet etching has a target which enables the side wall oxide film spacer to have a thickness ranging from 50 to 500 Å.

Figure 2F:
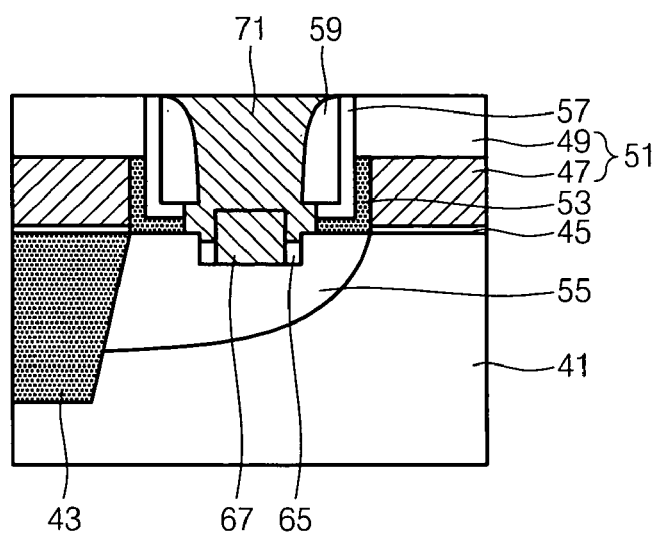

Subsequently, as shown in FIG. 2f, after the wet etching process is carried out, a second polysilicon layer is deposited on an upper surface of overall structure inclusive of the landing plug contact hole 63. Then, the second polysilicon layer is subjected to a CMP process to form a landing plug 71 in the landing plug contact hole 63. Herein, the second polysilicon layer may be made from doped or undoped polysilicon.

As described above, according to a MOS transistor formation method according to the present invention, in which, during formation of a MOS transistor, when a refresh time is improved by blocking phosphorus out diffusion and improving electric field by means of an oxide film side wall after forming a landing plug contact, an oxide film side wall on a silicon surface is eliminated and an electric current path is induced to the surface so as to compensate for electric current reduction due to increase of LDD resistance, so that a write margin of a cell transistor can be improved.

The preferred embodiment of the present invention has been described for illustrative purposes, and those skilled in the art will appreciate that various modifications, additions and substitutions are possible, without departing from the scope and spirit of the invention as disclosed in the accompanying claims.

What is claimed is:

1. A MOS transistor formation method comprising the steps of:

forming a gate oxide film and a gate electrode on a device region of a silicon substrate;

forming a nitride film spacer on one side surface of the gate electrode;

forming an interlayer dielectric layer on an upper surface of overall structure inclusive of the nitride film spacer;

forming a landing plug contact hole by over-etching the interlayer dielectric layer and an active region of the silicon substrate;

forming an oxide film on an upper surface of overall structure inclusive of the landing plug contact hole;

forming a side wall oxide film spacer by selectively eliminating the oxide film so that the oxide film remains only on a side wall of the landing plug contact hole;

forming a first landing plug pattern in a lower portion of the landing plug contact hole;

eliminating exposed side wall oxide film spacer and etching inside of a first landing plug pattern, thereby forming an auxiliary groove which expands area of the landing plug contact hole; and forming a second landing plug pattern in the landing plug contact hole including the first landing plug pattern and the auxiliary groove.

2. The MOS transistor formation method as claimed in claim 1, wherein the oxide film is made from any of oxide-based materials, including HLD, HTO, HDP, USG, and BPSG.

3. The MOS transistor formation method as claimed in claim 1, wherein the oxide film is made from nitride or $Al_2O_3$.

4. The MOS transistor formation method as claimed in claim 1, wherein the oxide film has a thickness of about 50 to 200 Å.

5. The MOS transistor formation method as claimed in claim 1, wherein the first landing plug pattern has a thickness of about 50 to 500 Å.

6. The MOS transistor formation method as claimed in claim 1, wherein the oxide film is eliminated by a wet etching process.

7. The MOS transistor formation method as claimed in claim 6, wherein the wet etching has a target which enables the oxide film to have a thickness ranging from 50 to 500 Å.

8. The MOS transistor formation method as claimed in claim 1, wherein the first landing plug pattern is made from doped or undoped polysilicon, nitride, or $Al_2O_3$.

9. The MOS transistor formation method as claimed in claim 1, wherein the second landing plug pattern is made from doped or undoped polysilicon.

10. The MOS transistor formation method as claimed in claim 1, wherein the active region of the silicon substrate is etched by 100 to 400 Å when the active region is subjected to an over-etching process.

11. The MOS transistor formation method as claimed in claim 1, wherein a buffer oxide film and the side wall oxide film spacer are formed between the gate electrode and the nitride film spacer.

12. The MOS transistor formation method as claimed in claim 11, wherein the buffer oxide film is made from any of oxide-based materials, including HLD, HTO, HDP, USG, and BPSG.

13. The MOS transistor formation method as claimed in claim 11, wherein the buffer oxide film is controlled to have a thickness of about 10 to 200 Å.

14. The MOS transistor formation method as claimed in claim 11, wherein the buffer oxide film and the side wall oxide film spacer are eliminated when the landing plug contact hole and the auxiliary groove are formed.

* * * * *